United States Patent
Wong et al.

(10) Patent No.: US 9,360,926 B2
(45) Date of Patent: Jun. 7, 2016

(54) MEMORY POWER SUPPLY LOAD MANAGEMENT

(71) Applicant: Synopsys, Inc., Mountain View, CA (US)

(72) Inventors: Yanyi Liu Wong, Bellevue, WA (US); Vikramaditya Kundur, Kirkland, WA (US); Agustinus Sutandi, Issaquah, WA (US); Ross Peterson, Seattle, WA (US); Rebecca Shiu Yun Cheng, Redmond, WA (US); Troy Gilliland, Bellevue, WA (US); Martin Niset, Seattle, WA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 14/449,907

(22) Filed: Aug. 1, 2014

(65) Prior Publication Data
US 2016/0034015 A1    Feb. 4, 2016

(51) Int. Cl.
*G11C 14/00* (2006.01)
*G06F 1/32* (2006.01)
*G06F 12/02* (2006.01)

(52) U.S. Cl.
CPC .............. *G06F 1/329* (2013.01); *G06F 12/023* (2013.01); *G06F 2212/251* (2013.01)

(58) Field of Classification Search
CPC ... G06F 1/329; G06F 12/023; G11C 13/0069; G11C 7/1006
USPC .......................................... 365/226
See application file for complete search history.

(56) References Cited

U.S. PATENT DOCUMENTS

| | | | |
|---|---|---|---|
| 7,477,543 B2 * | 1/2009 | Choi ........................ | 365/185.03 |
| 7,724,570 B1 * | 5/2010 | Lindhorst et al. ........ | 365/185.08 |
| 7,724,571 B1 * | 5/2010 | Lindhorst et al. ........ | 365/185.08 |
| 2007/0171727 A1 * | 7/2007 | Choi ........................ | 365/185.23 |

* cited by examiner

*Primary Examiner* — Han Yang
*Assistant Examiner* — Xiaochun L Chen
(74) *Attorney, Agent, or Firm* — Alston & Bird LLP

(57) ABSTRACT

Methods and systems for storing data are disclosed. The systems are configured to perform the methods and the methods may include, for example, receiving electronic data to be stored, partitioning the data into multiple segments, and storing each segment in a memory during a separate write cycle. The methods may also include programming a compensation load so that power provided by a power supply during the storing of each segment is substantially the same.

21 Claims, 11 Drawing Sheets

| | | |
|---|---|---|
| Data Word | 1101001001011010 | |
| 1st write cycle | 1101001001010000 | 0 |
| 2nd write cycle | 0000000000001010 | 4 |
| | Memory cell programming | Compensation load programming |

*FIG. 8*

| | | |
|---|---|---|
| Data Word | 110100100101 1010 | |
| 1st write cycle | 110100100000 0000 | 0 |
| 2nd write cycle | 000000001011 1010 | 0 |
| | Memory cell programming | Compensation load programming |

MEMORY POWER SUPPLY LOAD MANAGEMENT

FIELD OF THE INVENTION

The present invention generally relates to programming a memory, and more particularly to driving the memory with consistent loads.

BACKGROUND OF THE INVENTION

Data storage devices electronically store information for later retrieval in a memory. Data is programmed, or written, into a memory using one or more drivers, which provide electronic signals causing individual cells within the memory to acquire a particular state. To determine what data is stored in a memory, the state of the individual cells is determined, and signals representing the state are generated.

Some memory technologies present to the drivers an electrical load, which varies according to the data being written. Because the load varies, the drivers must be designed and manufactured so as to be able to drive the maximum possible load.

Accordingly, conventional data drivers are overdesigned. As a result, conventional data drivers are larger and require more power than is necessary.

In addition, in memory technologies whose load is data dependent, the effectiveness of programming is also data dependent. As a result, when the data being written causes a small load to be presented, the individual cells being written may be overprogrammed. Likewise, when the data being written causes a large load to be presented, the individual cells being written may be underprogrammed.

BRIEF SUMMARY OF THE INVENTION

One inventive aspect is a method of storing data. The method includes receiving electronic data to be stored, partitioning the data into multiple segments, and storing each segment in a memory during a separate write cycle. The method also includes programming a compensation load so that power provided by a power supply during the storing of each segment is substantially the same.

Another inventive aspect is a non-transitory computer readable medium including instructions, which, when executed, cause the computer to perform a method. The method includes receiving electronic data to be stored, partitioning the data into multiple segments, and storing each segment in a memory during a separate write cycle. The method also includes programming a compensation load so that power provided by a power supply during the storing of each segment is substantially the same.

Another inventive aspect is a memory circuit, including a memory array, a programmable compensation load, and a power supply configured to provide power to the memory array and the compensation load. The memory circuit also includes a controller configured to receive electronic data to be stored in the memory array, partition the data into multiple segments, and cause each segment to be stored in the memory array during a separate write cycle. The controller is also configured to program the programmable compensation load so that the power from the power supply during the storing of each segment is substantially the same.

BRIEF DESCRIPTION OF THE DRAWINGS

FIG. 8 is a data table illustrating data used in an embodiment of a method of programming a memory having a load compensation circuit.

FIG. 10 is a data table illustrating data used in an embodiment of a method of programming a memory having a load compensation circuit.

DETAILED DESCRIPTION OF THE INVENTION

Particular embodiments of the invention are illustrated herein in conjunction with the drawings.

Various details are set forth herein as they relate to certain embodiments. However, the invention can also be implemented in ways which are different from those described herein. Modifications can be made to the discussed embodiments by those skilled in the art without departing from the invention. Therefore, the invention is not limited to particular embodiments disclosed herein.

Figure 1:
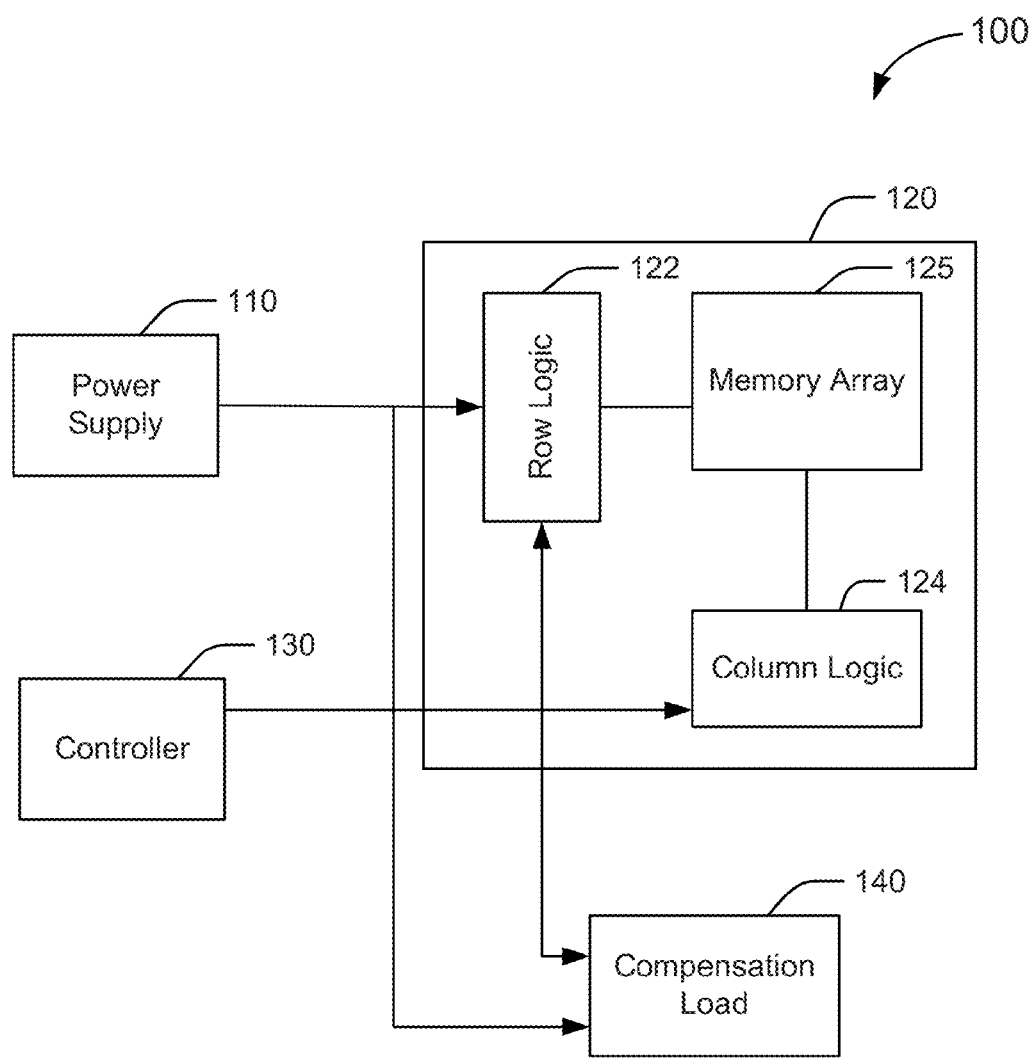
FIG. 1 is a block diagram illustrating a memory circuit.

FIG. 1 is a block diagram illustrating a memory circuit 100. The memory circuit 100 includes power supply 110, memory unit 120, controller 130, and compensation load 140. Power supply 110, controller 130, and compensation load 140 are used to read and write data to and from memory unit 120.

Memory unit 120 includes memory array 125, row logic 122, and column logic 124. The memory array 125 stores data in response to write commands, and provides data stored therein in response to read commands. The row logic 122 and the column logic 124 provide the read and write commands to memory array 125. In addition, row logic 122 and column logic 125 provide the data to be written to memory array 125, and provide data read from memory array 125 to other circuitry (not shown).

Controller 130 receives instructions from other circuitry (not shown), and provides read and write commands to memory unit 120. In addition, controller 130 receives data to be stored from other circuitry (not shown) and provides corresponding data to memory unit 120.

Controller 130 also provides control signals which control compensation load 140, for example, as discussed in further detail elsewhere herein.

Power supply 110 provides one or more reference voltages or currents to memory unit 120 and compensation load 140. In some embodiments, power supply 110 is regulated, for example using a sensing circuit and a feedback circuit, where the regulated voltage is based on a reference voltage. In some embodiments, power supply 110 includes a charge pump circuit configured to provide the one or more reference voltages or currents. In some embodiments, the charge pump circuit comprises a voltage doubler circuit.

Numerous power supply circuits may be used in implementations of the memory circuit of FIG. 1. The systems, devices, and methods described herein may be applied using power supply circuits not specifically described or referenced herein.

Compensation load 140 receives one or more reference voltages or currents from power supply 110 and one or more control signals from controller 130. Based on the control signals, compensation load 140 presents a programmable load to power supply 110. As discussed further elsewhere herein, compensation load 140 may be programmed so as to present, in combination with memory unit 120, a consistent load to power supply 110.

Figure 2:
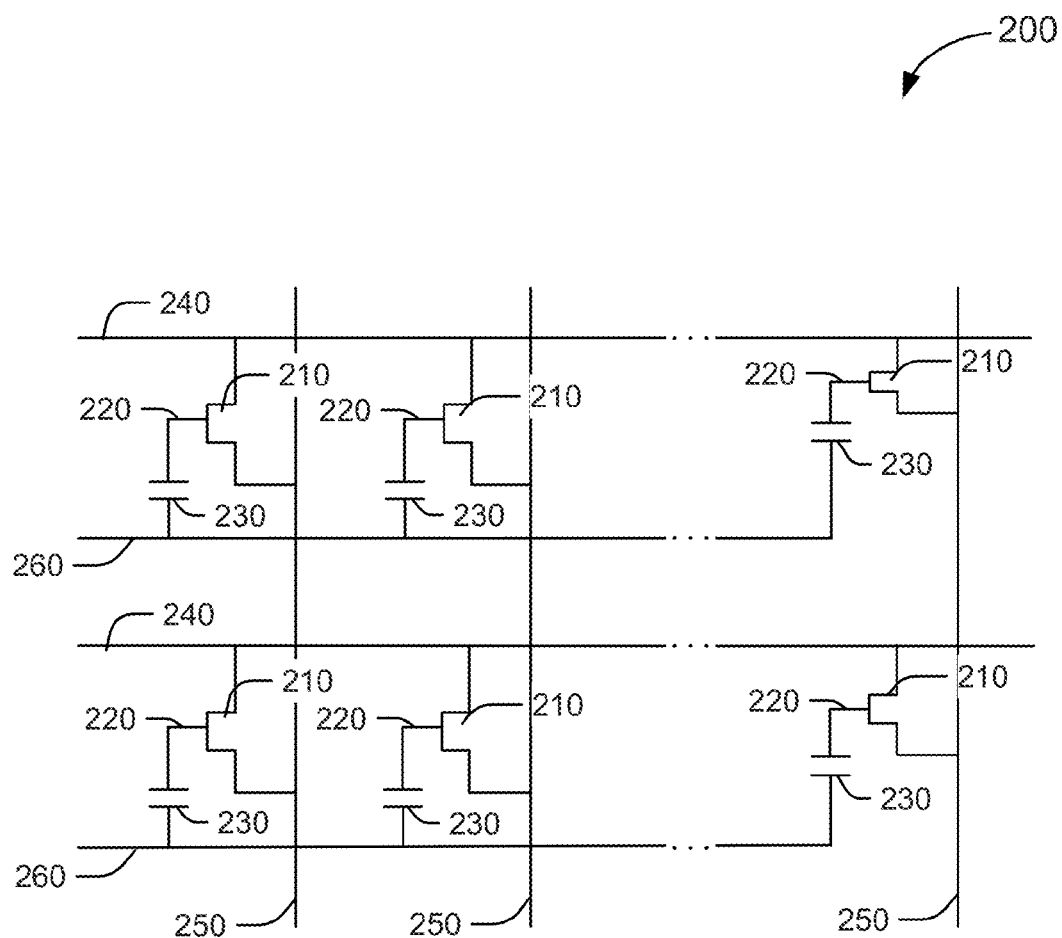
FIG. 2 is a schematic illustrating an embodiment of a memory array which can be used in embodiments of the memory circuit of FIG. 1.

FIG. 2 is a schematic illustrating an embodiment of a memory array 200 which can be used in embodiments of memory circuit 100 of FIG. 1. In the embodiment of FIG. 2, memory array 200 is a nonvolatile EEPROM memory. Other types of volatile and nonvolatile memories may be used. As shown, memory array 200 includes an array of memory cells each including a transistor 210 with a floating gate 220 connected to a storage capacitor 230. The drains of the transistors 210 occupying a particular row are connected to a word line 240 configured to carry word signals to or from the transistors 210 of the particular row. The sources of the transistors 210 occupying a particular column are connected to a bit line 250 configured to carry bit signals to or from the transistors 210 of the particular column. In addition, each of the storage capacitors 230 of a particular row is connected to a row select line 260 configured to select particular rows of the memory array 200 during read and program operations.

In this embodiment, individual memory cells are programmed by causing current to flow through the transistors of the memory cells to be programmed. An electric field caused by the voltage difference between the gate and channel causes hot electrons generated by current flowing through the channel to accumulate on the floating gate. The accumulated carriers on the floating gate of programmed memory cells allow the programmed memory cells to be distinguished from unprogrammed memory cells because of a shift in current carrying characteristics of the programmed memory cells caused by the carriers accumulated on the floating gate. For example, in response to a row select signal being driven on a row select line of a row, programmed memory cells of the row may become conductive, while unprogrammed memory cells of the row may be unconductive.

In this embodiment, to program memory cells of a particular row, a programming voltage is driven on the word line of the particular row. In addition, the row select line of the particular row is driven with a voltage which causes to cause the transistors of the particular row to be turned on. Transistors of other rows remain off.

Each of the bit lines is driven with a data voltage corresponding with a data state to be programmed into the corresponding memory cell of the particular row. As a result, transistors of the particular row whose bit lines are programmed with a data voltage causing the transistors to be conductive, conduct current from the word line of the particular row to the corresponding bit lines. As discussed above, hot electrons from the channels of these transistors accumulate on their floating gates to program these memory cells.

Transistors of the particular row whose bit lines are programmed with a data voltage causing the transistors to not be conductive, do not conduct current from the word line of the particular row to the corresponding bit lines. Therefore, hot electrons from the channels of these transistors do not accumulate on their floating gates and these memory cells remain unprogrammed.

Because number of memory cells which are programmed corresponds with the number of transistors conducting current, the current load presented to the driver of the word line is dependent on the number of memory cells being programmed.

Figure 3A:
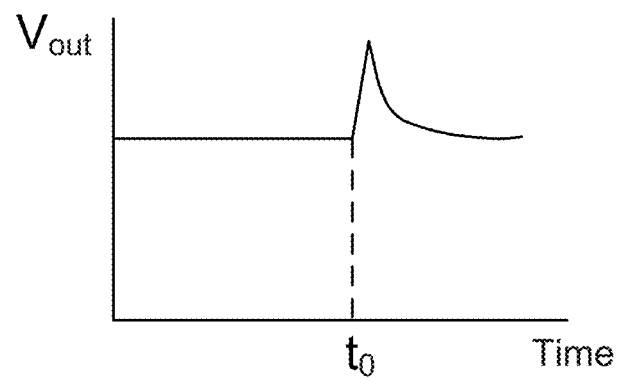
FIGS. 3A and 3B are signal graphs illustrating an effect of load on an output of a memory power supply.
Figure 3B:
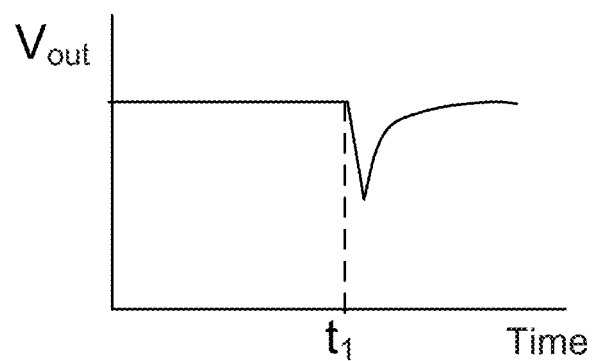

FIGS. 3A and 3B are signal graphs illustrating an effect of load on an output of a memory power supply.

In the signal graphs of FIG. 3A, the output voltage Vout of a power supply is shown over time. At time $t_0$, the load presented to power supply is suddenly decreased. As shown in FIG. 3A, in response to the sudden decrease in load, the output voltage of the power supply correspondingly increases, and after a delay, is returned to the nominal output voltage level, for example, as a result of the power supply being regulated by a feedback system.

The temporary increase in output voltage of the power supply has undesirable effects. For example, because the voltage is greater than the nominal programming voltage, overprogramming or inconsistent programming may occur. In addition, the state of unprogrammed memory cells may be disturbed as a result of the changing power supply voltage causing carriers to be injected onto their floating gates. Furthermore, the reliability of the memory may be adversely affected by the temporary high voltages.

In the signal graphs of FIG. 3B, the output voltage Vout of a power supply is shown over time. At time $t_1$, the load presented to power supply is suddenly increased. As shown in FIG. 3B, in response to the sudden increase in load, the output voltage of the power supply correspondingly decreases, and after a delay, is returned to the nominal output voltage level, for example, as a result of the power supply being regulated by a feedback system.

The temporary decrease in output voltage of the power supply has undesirable effects. For example, because the voltage is less than the nominal programming voltage, underprogramming or inconsistent programming may occur.

In order to reduce or eliminate the undesirable effects of changes in output voltage, the load presented to the power supply may be controlled so as to be consistent or substantially unchanging.

Referring again to FIG. 1, compensation load 140 presents a programmable load to the power supply. As a result, during programming, the load presented to the power supply includes the load presented to the power supply by the memory array 125 and also includes the load presented to the power supply by the programmable compensation load 140. In some embodiments, the compensation load 140 is dynamically programmed such that the load presented to the power supply by the combination of the memory array 125 and the compensation load 140 is controlled, for example, to be independent of the data being written to the memory array 125.

Figure 4:
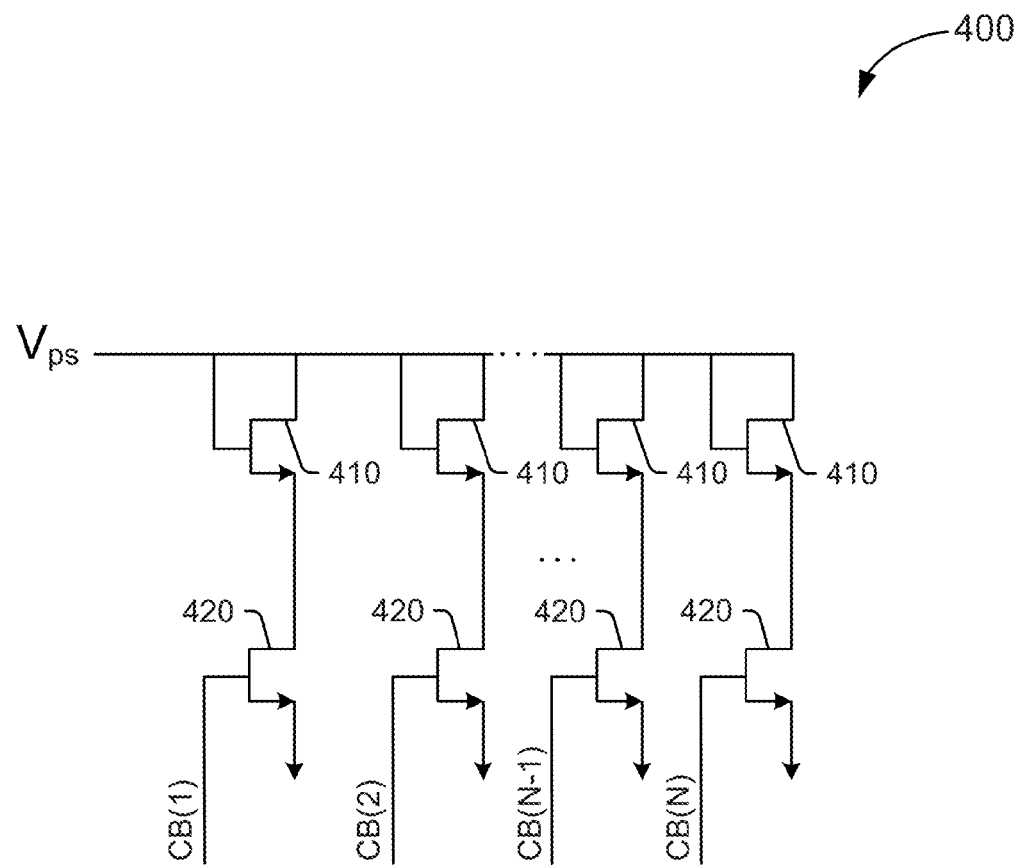
FIG. 4 is a schematic illustrating an embodiment of a load compensation circuit of the memory circuit of FIG. 1.

FIG. 4 is a schematic illustrating an embodiment of a programmable load compensation circuit 400, which may be used in implementations of the memory circuit 100 of FIG. 1. Compensation circuit 400 includes current source transistors 410 and corresponding switches 420.

Each of the current source transistors 410 is diode connected and conditionally presents a current load to the power supply circuit providing current to the input node Vps. Each of the current source transistors 410 is also connected to a corresponding one of the switches 420. Each current source transistor 410 presents a current load to the power supply circuit according to the state of the corresponding switch 420.

The state of each of the switches 420 is controlled by a corresponding control bit signal CB. For example, if the voltage of a control bit signal CB causes the corresponding switch 420 to be conductive, current from the power supply will flow through the corresponding current source transistor 410 and through the corresponding switch 420 to ground. The conductivity characteristics of the current source transistors 410 and the switches 420 are configured such that the value of the current load on the power supply circuit substantially corresponds with the transistor characteristics of the corresponding current source transistor 410. In addition, the current source transistors 410 are configured such that the value of the current is substantially equal to the current provided to a single memory cell of the memory array 125 during the programming thereof.

Referring again to FIG. 1, controller 130 provides control signals which control compensation load 140. For example, controller 130 may be configured to provide the control bit signals CB. In some embodiments, controller 130 is configured to provide encoded control data to a decoder, which is configured to generate the control bit signals CB based on the encoded control data.

Figure 5:
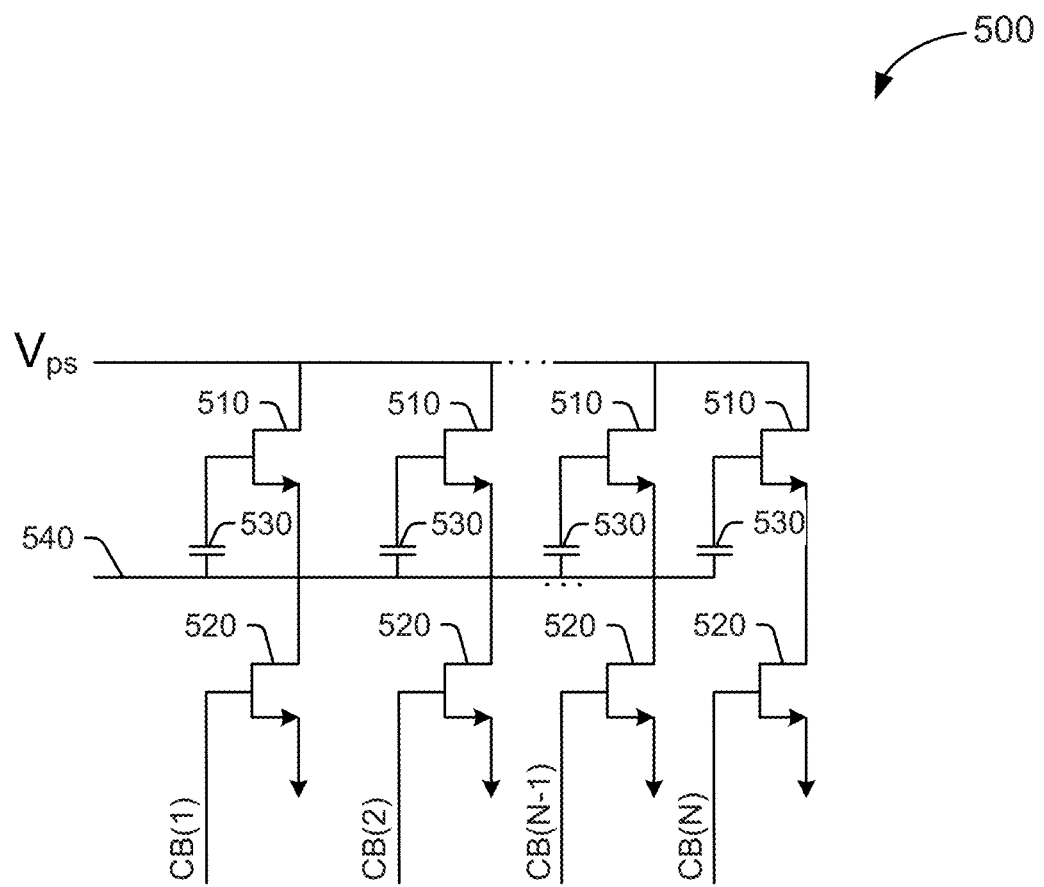
FIG. 5 is a schematic illustrating an embodiment of a load compensation circuit of the memory circuit of FIG. 1.

FIG. 5 is a schematic illustrating an embodiment of a load compensation circuit 500, which may be used and implementations of the memory circuit 100 of FIG. 1. Compensation circuit 500 includes memory cell matching transistors 510, switches 520, and memory cell matching capacitors 530.

Each of the memory cell matching transistors 510 conditionally presents a current load to the power supply circuit providing current to the input node Vps. Each of the memory cell matching transistors 510 is also connected to a corresponding one of the switches 520. Each memory cell matching transistor 510 presents a current load to the power supply circuit according to the state of the corresponding switch 520 and according to the state of select line 540, connected to capacitors 530.

The state of each of the switches 520 is controlled by a corresponding control bit signal CB. For example, if the voltage of a control bit signal causes the corresponding switch 520 to be conductive, current from the power supply will flow through the corresponding memory cell matching transistor 510 and through the corresponding switch 520 to ground. The conductivity characteristics of the memory cell matching transistor 510 and the switches 520 are configured such that the value of the current load on the power supply substantially corresponds with the transistor characteristics of the corresponding memory cell matching transistor 510. In addition, the memory cell matching transistor 510 and the memory cell matching capacitors 530 respectively match the transistors and capacitors of the memory cells of the memory array, such that the value of the current load on the power supply matches and is substantially equal to the current provided to a single memory cell of the memory array 125 during the programming thereof.

Referring again to FIG. 1, controller 130 may be configured to provide the control bit signals CB to compensation circuit 500. In some embodiments, controller 130 is configured to provide encoded control data to a decoder, which is configured to generate the control bit signals CB based on the encoded control data.

Figure 6:
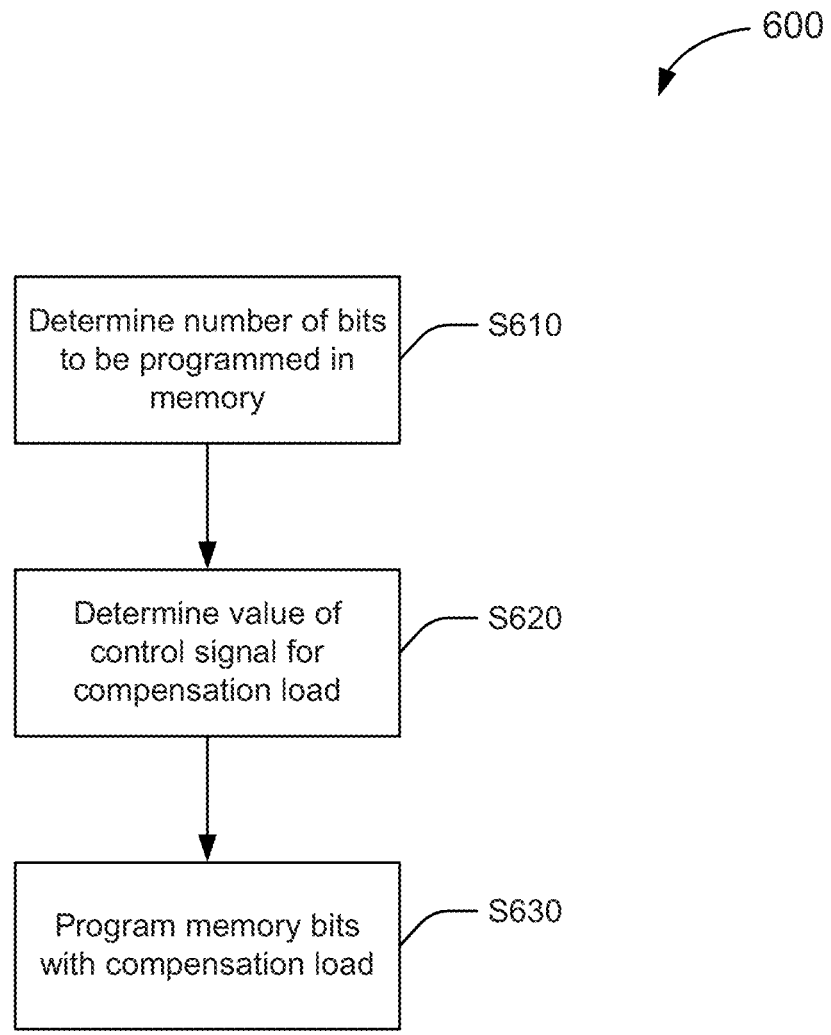
FIG. 6 is a flowchart illustrating an embodiment of a method of using a load compensation circuit.

FIG. 6 is a flowchart illustrating an embodiment of a method 600 of using a load compensation circuit. The method may be performed, for example, by a processor communicating with memory circuit 100 of FIG. 1. In some embodiments, the processor is integrated with the controller 130.

During each write cycle, data is stored in the memory array 125 along a row or a portion of a row of memory cells. The number of memory cells in the row or portion of the row may correspond with an upper limit of current sourceable by the power supply.

For example, if the power supply is capable of providing enough current to program 16 memory cells, the number of memory cells in the row or portion of the row may be equal to 16.

At S 610, the processor determines the number of memory cells to be programmed in the memory array 125 during a next write cycle. The number of memory cells to be programmed during the next write cycle is determined based on the data to be written. For example, if the number of memory cells in the row or portion of the row to receive data is equal to 16, the processor references the next 16 bits of data to be written. If, for example, 12 of the next 16 bits have data corresponding with memory cells to be programmed, and 4 bits have data corresponding with memory cells to remain unprogrammed, the processor determines that 12 memory cells are to be programmed during the next write cycle.

At S 620, the processor determines a value for a control signal to be provided to the programmable compensation load 140. The value for the control signal represents a current load for the programmable compensation load 140 to present to the power supply 110. The value is generated so that the controller 130 provides the control signal to the programmable compensation load 140 to cause the programmable compensation load 140 to present to the power supply 110 a programmed current load. As a result, the combination of the current load presented to the power supply 110 by the memory cells being programmed and the current load presented to the power supply 110 by the programmable compensation load 140 is consistent for each write cycle.

For example, if the number of memory cells in the row or portion of the row to receive data is equal to 16, the processor references the next 16 bits of data to be written. If, for example, 12 of the next 16 bits have data corresponding with memory cells to be programmed, and 4 bits have data corresponding with memory cells to remain unprogrammed, the processor determines that the programmable compensation load 140 is to be programmed so as to present to the power supply 110 a current load, which is equivalent to the current load of 4 memory cells being programmed. As a result, the total current load presented to the power supply is equal to that generated by 16 memory cells being programmed, where the current load of 12 memory cells is generated by 12 memory cells actually being programmed, and the current load of 4 memory cells is generated by the compensation load 140.

Using the method of FIG. 6, the programmable compensation load 140 may be programmed for each write cycle so that the total current load for the power supply 110 is equivalent of the current load of 16 memory cells being programmed. Accordingly, in this embodiment, for each write cycle, the processor is configured to determine the number, n, of memory cells actually being programmed based on the next 16 bits of data. In addition, the programmable compensation load 140 is programmed to cause a load corresponding with the current load of 16-n memory cells being programmed to be presented to the power supply 110.

At S 630, the memory array 125 is programmed according to the data to be stored while the programmable compensation load 140 is programmed according to the value determined at S 620.

Figure 7:
FIG. 7 is a data table illustrating data used in an embodiment of a method of programming a memory having a load compensation circuit.

FIG. 7 is a data table illustrating data used in an embodiment of an alternative method of programming a memory having a load compensation circuit.

In the method related to the data table of FIG. 7, the number of data bits written to memory array 125 during each write cycle is dynamic so that the number of memory cells programmed during each write cycle is maximized.

In the example of FIG. 7, the data word to be written to the memory has 16 bits, 8 of which require memory cells in the memory array 125 to be programmed. Accordingly, to store the data of the 16 bits of the data word, 8 memory cells in the memory array 125 are to be programmed.

If, for example, the power supply 110 has a power supplying capacity sufficient for programming up to 3 memory cells during each write cycle, the data word is partitioned into multiple segments, where each segment has 3 bits requiring memory cells to be programmed (corresponding with the capacity of the power supply 110), or has N modulo M bits requiring memory cells to be programmed, where N is equal to the quantity of bits in the data word requiring power to store, and M is equal to the maximum quantity of bits requiring power to store, as determined based on the power supplying capacity of the power supply 110.

Each of the data word segments will be written to the memory array 125 during a separate write cycle. For write cycles of segments having fewer than 3 bits requiring memory cells in the memory array 125 to be programmed, the compensation load 140 is programmed to present a load to the power supply 110 such that the current load experienced by power supply 110 resulting from the combination of the memory cells being programmed and that of the compensation load 140 is equal to the current load of 3 memory cells being programmed. Therefore, the compensation load is programmed to require an amount of power substantially equal to the power required when programming N/M-N modulo M memory cells.

In the example related to FIG. 7, the data word is partitioned into 3 segments. During the first write cycle, the first data word segment is written to memory array 125. As indicated in FIG. 7, the data word segment of the first write cycle presents a current load of 3 memory cells being programmed. In addition, the compensation load 140 is programmed to present no current load to the power supply 110. As a result, during the first write cycle, the current load experienced by the power supply 110 is equal to that of the current load of 3 memory cells being programmed.

During the second write cycle, the second data word segment is written to memory array 125. As indicated in FIG. 7, the data word segment of the second write cycle presents a current load of 3 memory cells being programmed. In addition, the compensation load 140 is programmed to present no current load to the power supply 110. As a result, during the second write cycle the current load experienced by the power supply 110 is equal to that of the current load of 3 memory cells being programmed.

During the third write cycle, the third data word segment is written to memory array 125. As indicated in FIG. 7, the data word segment of the third write cycle presents a current load of 2 memory cells being programmed. In addition, the compensation load 140 is programmed to present to the power supply 110 a current load corresponding with 1 memory cell being programmed. As a result, during the third write cycle the current load experienced by the power supply 110 is equal to that of the current load of 3 memory cells being programmed, where the current load of 3 memory cells is generated by 2 memory cells actually being programmed, and the current load of 1 memory cell is generated by the compensation load 140.

FIG. 8 is a data table illustrating data used in an embodiment of the method related to that discussed with reference to FIG. 7.

In the example of FIG. 8, the data word to be written to the memory has 16 bits, 8 of which require memory cells in the memory array 125 to be programmed. Accordingly, to store the data of the 16 bits, 8 memory cells in the memory array 125 are to be programmed.

If, for example, the power supply 110 has cappacity to supply current sufficient for programming 6 memory cells during each write cycle, the data word is partitioned into multiple segments, each having 6 or fewer bits requiring memory cells in the memory array 125 to be programmed. As in the case for the example of FIG. 7, each of the data word segments will be written to the memory array 125 during a separate write cycle. For write cycles of segments having fewer than 6 bits requiring memory cells in the memory array 125 to be programmed, the compensation load 140 is programmed to present a load to the power supply 110 such that the current load experienced by power supply 110 resulting from the combination of the memory cells being programmed and that of the compensation load 140 is equal to the current load of 6 memory cells being programmed.

In the example related to FIG. 8, the data word is partitioned into 2 segments. During the first write cycle, the first data word segment is written to memory array 125. As indicated in FIG. 8, the data word segment of the first write cycle presents a current load of 6 memory cells being programmed. In addition, the compensation load 140 is programmed to present no load to the power supply 110. As a result, during the first write cycle the current load experienced by the power supply 110 is equal to that of the current load of 6 memory cells being programmed.

During the second write cycle, the second data word segment is written to memory array 125. As indicated in FIG. 8, the data word segment of the second write cycle presents a current load of 2 memory cells being programmed. In addition, the compensation load 140 is programmed to present to the power supply 110 a current load corresponding with 4 memory cells being programmed. As a result, during the second write cycle the current load experienced by the power supply 110 is equal to that of the current load of 6 memory cells being programmed, where the current load of 6 memory cells is generated by 2 memory cells actually being programmed, and the current load of 4 memory cells is generated by the compensation load 140.

Figure 9:
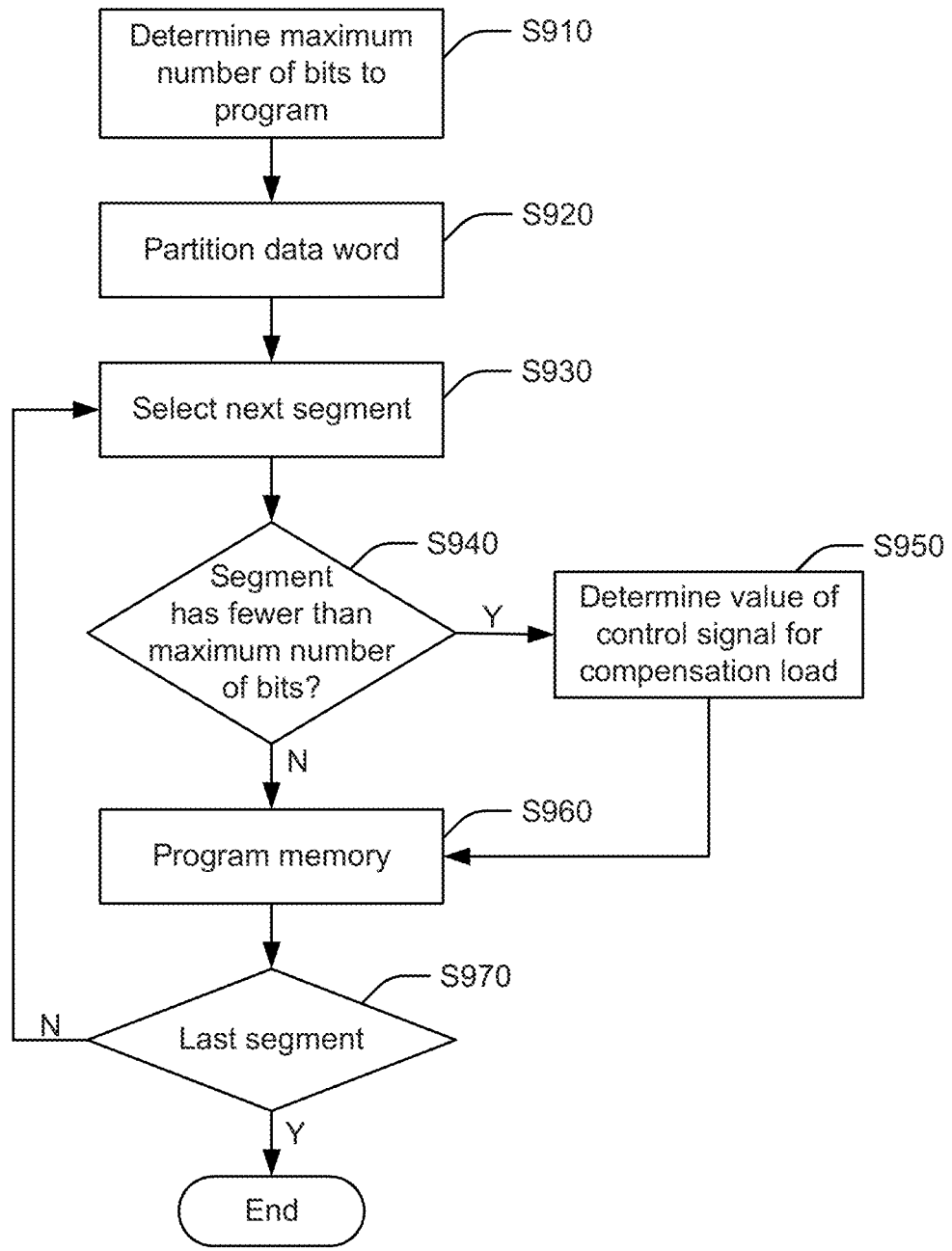
FIG. 9 is a flowchart illustrating an embodiment of a method of programming a memory having a load compensation circuit.

FIG. 9 is a flowchart illustrating an embodiment of a method of programming a memory having a load compensation circuit. The method may be performed, for example, by a processor communicating with memory circuit 100 of FIG. 1. In some embodiments, the processor is integrated with the controller 130.

At S 910, the processor determines a maximum number of memory cells which may be programmed during each write cycle. In some embodiments, the processor determines the maximum number of memory cells by referencing a memory location storing data corresponding to the maximum number of memory cells which may be programmed.

In some embodiments, the maximum number of memory cells is determined based at least in part on performance characteristics of the power supply 110. For example, if the power supply 110 is designed to generate a desired voltage while sourcing a maximum predetermined fixed current, and the memory cells of memory array 125 are designed to sink a fixed current, the maximum number of memory cells may be determined based at least in part on a division of the maximum predetermined fixed current of the power supply by the fixed current of the memory cells. In some embodiments, the current sourcing capacity of the power supply 110 is measured during operation. In some embodiments, the current sunk by the memory cells is measured during operation. If either or both of the current sourcing capacity of the power supply 110 and the current sunk by the memory cells is measured during operation, the maximum number of memory cells to be programmed during each write cycle may be determined based at least in part on the measured values instead of the corresponding design values.

At S 920, a data word to be written is partitioned based on the determined maximum number of memory cells to be programmed during each write cycle. For example, in the example discussed with reference to FIG. 7, because the maximum number of memory cells to be programmed during each write cycle is equal to 3, and the data word to be written includes 8 bits having a state corresponding with memory cells to be programmed, the data word is partitioned into a number of segments equal to the next whole number greater than 8/3, namely 3 segments. In this example, 2 segments have 3 bits requiring memory cells to be programmed (the maximum nuber of bits), and one segment has 2 bits requiring memory cells to be programmed (8 mod 3 bits).

At S 930, a next segment is selected.

At S 940, the selected segment is analyzed to determine whether the selected segment has fewer bits in a state corresponding with memory cells to be programmed than the maximum number of memory cells which can be program by the power supply during a single write cycle.

If the selected segment does not have fewer bits in a state corresponding with memory cells to be programmed than the maximum number of memory cells which can be programmed during a single write cycle, the method continues to S 960.

If the selected segment has fewer bits in a state corresponding with memory cells to be programmed than the maximum number of memory cells which can be programmed during a single write cycle, at S 950, the processor determines a value for a control signal to be provided to the programmable compensation load 140. The value is generated so that in response to the controller 130 providing the control signal to the programmable compensation load 140, the programmable compensation load 140 presents to the power supply 110 a programmed current load such that the combination of the current load presented to the power supply 110 by the memory cells being programmed and the current load presented to the power supply 110 by the programmable compensation load 140 is consistent for each write cycle.

For example, in the example discussed with reference to FIG. 7, because the maximum number of memory cells to be programmed during each write cycle is equal to 3, and the data word to be written includes 8 bits having a state corresponding with memory cells to be programmed, the third segment has 2 bits requiring memory cells to be program (=8 mod 3 bits). For the third segment, the programmable compensation load 140 is programmed with a value causing the programmable compensation load 140 to present a current load to the power supply 110 corresponding with the current load of 1 (=3-8 mod 3) memory cell being programmed.

At S 960, the memory array 125 is programmed according to the data word segment to be written while the programmable compensation load 140 presents the current load to the power supply 110 associated with the value determined at S 950. As a result, while the data word segment is written, the current load experienced by the power supply 110 is consistent during each write cycle.

For example, in the example discussed with reference to FIG. 7, because the maximum number of memory cells to be programmed during each write cycle is equal to 3, the current load presented to the power supply 110 by the combination of memory cells being programmed and the compensation load 140 is equal to the current load of programming 3 memory cells.

At S 970, the processor determines whether the last data word segment has been written to the memory array 125. If the last data word segment has not been written, the method returns to S 930, otherwise the method ends.

FIG. 10 is a data table illustrating data used in an embodiment of an alternative method of programming a memory having a load compensation circuit.

In the method related to the data table of FIG. 10, the number of data bits written to memory array 125 during each write cycle is dynamic and the number of memory cells programmed during each write cycle is maximally equalized.

In the example of FIG. 10, the data word to be written to the memory has 16 bits, 8 of which require memory cells in the memory array 125 to be programmed. Accordingly, to store the data of the 16 bits, 8 memory cells in the memory array 125 are to be programmed.

If, for example, the power supply 110 is configured to supply current sufficient for programming 6 memory cells during each write cycle, the data word is partitioned into multiple segments, each having 6 or fewer bits requiring memory cells in the memory array 125 to be programmed. In this embodiment, the data word is partitioned such that each of the data word segments has the same number of bits requiring memory cells to be programmed or such that the number of bits requiring memory cells to be programmed in the segments differs by no more than 1. Accordingly, after partitioning, one or more data word segments has n bits requiring memory cells to be programmed, and one or more data word segments may have n-1 bits requiring memory cells to be programmed.

As in the case for the examples of FIGS. 7 and 8, each of the data word segments will be written to the memory array 125 during a separate write cycle. For any write cycles of segments having n-1 bits requiring memory cells in the memory array 125 to be programmed, the compensation load 140 is programmed to present a current load to the power supply 110 equal to that of 1 memory cell being programmed. As a result, in each write cycle, the current load experienced by power supply 110 resulting from the combination of the memory cells being programmed and that of the compensation load 140 is equal to the current load of n memory cells being programmed.

In the example related to FIG. 10, the data word is partitioned into 2 segments. During the first write cycle, the first data word segment is written to memory array 125. As indicated in FIG. 10, the data word sesegment of the first write cycle presents a current load of 4 memory cells being programmed. In addition, the compensation load 140 is programmed to present no current load to the power supply 110. As a result, during the first write cycle the current load experienced by the power supply 110 is equal to that of the current load of 4 memory cells being programmed.

During the second write cycle, the second data word segment is written to memory array 125. As indicated in FIG. 10, the data word segment of the second write cycle also presents a current load of 4 memory cells being programmed. In addition, the compensation load 140 is programmed to present no current load to the power supply 110. As a result, during the second write cycle the current load experienced by the power supply 110 is equal to that of the current load of 4 memory cells being programmed.

For data words partitioned such that one or more data word segments has n−1 bits requiring memory cells to be programmed, during the corresponding write cycles, the compensation load 140 is programmed to present a current load to the power supply 110 equal to that of 1 memory cell being programmed. As a result, during each write cycle for the data word, the current load experienced by power supply 110 resulting from the combination of the memory cells being programmed and that of the compensation load 140 is equal to the current load of n memory cells being programmed.

For example, if the data word of FIG. 10 had 24 bits, and the data word were partitioned into three segments, where the first and second segments each have 4 bits requiring memory cells to be programmed, and the third segment has 3 bits requiring memory cells to be programmed, during a third write cycle, the 3 bits of the data word would be written to the memory array 125 while the compensation load 140 was providing a current load to the power supply 110 equal to 1 memory cell being programmed. As a result, during each of the three write cycles for the 24 bit data word, the current load experienced by power supply 110 resulting from the combination of the memory cells being programmed and that of the compensation load 140 is equal to the current load of 4 memory cells being programmed.

Figure 11:
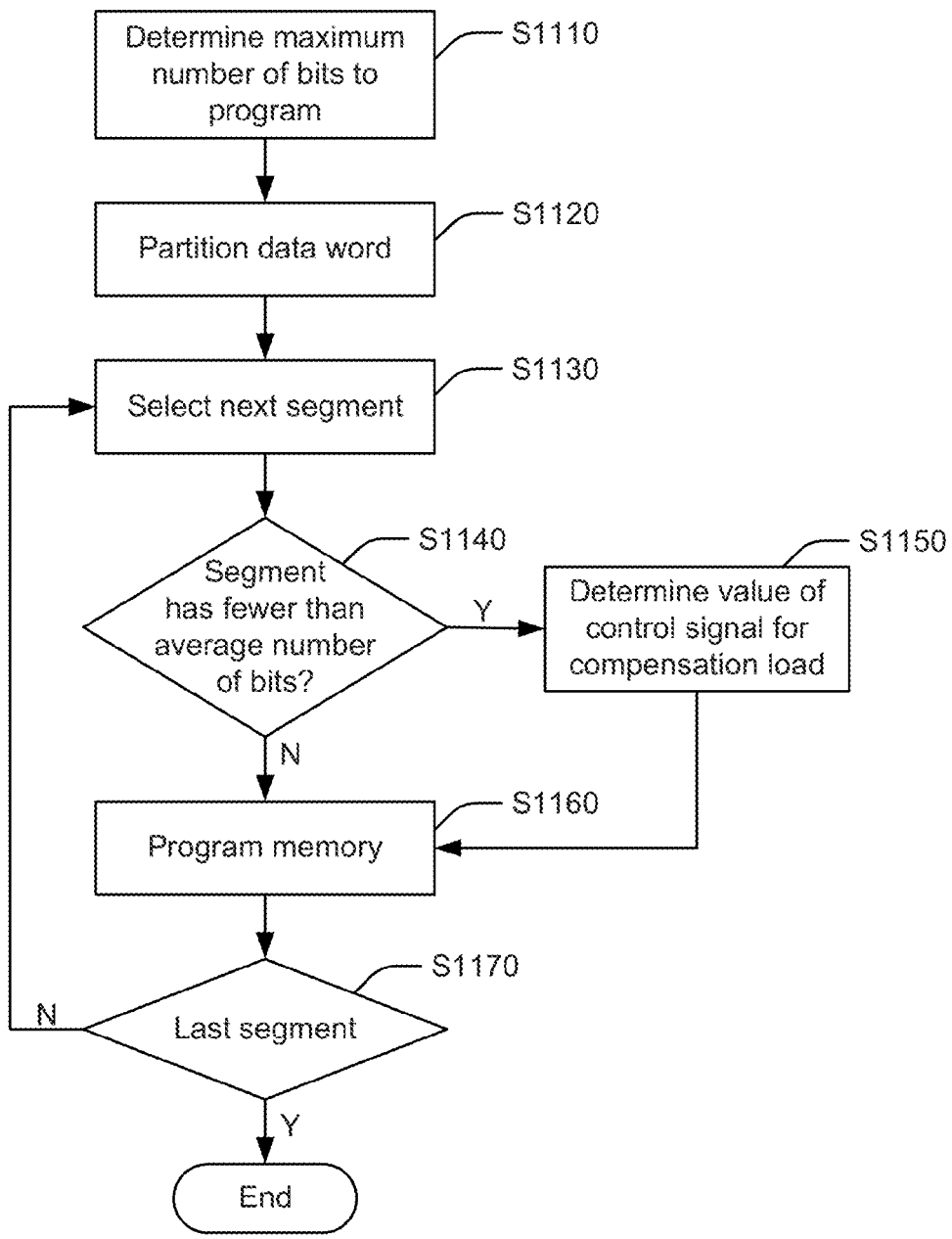
FIG. 11 is a flowchart illustrating an embodiment of a method of programming a memory having a load compensation circuit.

FIG. 11 is a flowchart illustrating an embodiment of a method of programming a memory having a load compensation circuit. The method may be performed, for example, by a processor communicating with memory circuit 100 of FIG. 1. In some embodiments, the processor is integrated with the controller 130.

At S 1110, the processor determines a maximum number of memory cells which may be programmed during each write cycle. In some embodiments, the processor determines the maximum number of memory cells using a method described elsewhere herein.

At S 1120, a data word to be written is partitioned based on the determined maximum number of memory cells to be programmed during each write cycle and based on the number of data bits in the data word which require memory cells in the memory array 125 to be programmed. For example, in the example discussed with reference to FIG. 10, because the maximum number of memory cells to be programmed during each write cycle is equal to 6, and the data word to be written includes 8 bits having a state corresponding with memory cells to be programmed, the data word is partitioned into a number of segments equal to the next whole number greater than 8/6, namely 2 segments. In this example, each of the 2 segments has 4 bits requiring memory cells to be programmed (8/2).

At S 1130, a next segment is selected.

At S 1140, the selected segment is analyzed to determine whether the selected segment has fewer bits in a state corresponding with memory cells to be programmed than the average number of bits requiring memory cells to be programmed for the data word (=8/2).

If the selected segment does not have fewer bits in a state corresponding with memory cells to be programmed than the average number of bits requiring memory cells to be programmed for the data word, the method continues to S 1160.

If the selected segment has fewer bits in a state corresponding with memory cells to be programmed than the average number of bits requiring memory cells to be programmed for the data word, at S 1150, the processor determines a value for a control signal to be provided to the programmable compensation load 140. The value is generated so that in response to the controller 130 providing the control signal to the programmable compensation load 140, the programmable compensation load 140 presents to the power supply 110 a programmed current load substantially equal to the current load of 1 memory cell being programmed.

For example, in the example discussed with reference to FIG. 10, because the maximum number of memory cells to be programmed during each write cycle is equal to 6, and the data word to be written includes 8 bits having a state corresponding with memory cells to be programmed, each of the first and second segments has 4 bits requiring memory cells to be programmed (=8/2). Because each of the first and second segments has 4 bits requiring memory cells to be programmed in the average number of bits requiring memory cells to be programmed for the data word is 4 (=8/2), the value is generated so that the programmable compensation load 140 presents no current load to power supply 100 during the first and second write cycles.

At S 1160, the memory array 125 is programmed according to the data word segment to be written while the programmable compensation load 140 presents the current load to the power supply 110 associated with the value determined at S 950. As a result, while the data word segment is written, the current load experienced by the power supply 110 is consistent during each write cycle.

For example, in the example discussed with reference to FIG. 10, because the number of memory cells programmed during each write cycle is equal to 4, the current load presented to the power supply 110 by the combination of memory cells being programmed and the compensation load 140 is equal to the current load of programming 4 memory cells.

At S 1170, the processor determines whether the last data word segment has been written to the memory array 125. If the last data word segment has not been written, the method returns to S 1130, otherwise the method ends.

The methods described herein may be encoded in instructions, which, when executed by a computer, cause the computer to perform the methods. The instructions may be stored on media readable by the computer. The media may be tangible, such as a non-transitory electronic memory.

Though the present invention is disclosed by way of specific embodiments as described above, those embodiments are not intended to limit the present invention. Based on the methods and the technical aspects disclosed above, variations and changes may be made to the presented embodiments by those skilled in the art without departing from the spirit and the scope of the present invention.

What is claimed is:

1. A method of storing data, the method comprising:
receiving electronic data to be stored;
partitioning the data into multiple segments;
storing each segment in a memory during a separate write cycle;
determining, for each segment, a number of memory cells required for storing the respective segment; and
programming a compensation load, based on the determined number of memory cells, to cause power provided by a power supply to remain substantially constant during the storing of each segment.

2. The method of claim 1, wherein the data is partitioned into a number of segments, wherein the number of segments is determined based in part on a maximum quantity of data bits requiring power to store.

3. The method of claim 2, wherein the maximum quantity of data bits requiring power to store is determined based at least in part on a power supplying capacity of the power supply and a power requirement for storing each data bit requiring power to store.

4. The method of claim 1, wherein each segment has a number of bits requiring power to store, wherein the number of bits requiring power to store is equal to either a maximum quantity of data bits requiring power to store or is equal to N modulo M, where N is equal to the quantity of data bits in the data requiring power to store and M is equal to the maximum quantity of data bits requiring power to store.

5. The method of claim 4, wherein while storing segments of the maximum quantity of data bits requiring power to store, the compensation load is programmed to require substantially no power, and wherein while storing segments of N modulo M data bits requiring power to store, the compensation load is programmed to require an amount of power substantially equal to the power required to store M-N modulo M data bits requiring power to store.

6. The method of claim 1, wherein each segment has a number of bits requiring power to store, wherein the number of bits requiring power to store is equal to either N or N-1.

7. The method of claim 6, wherein while storing segments of N data bits requiring power to store, the compensation load is programmed to require substantially no power, and wherein while storing segments of N-1 data bits requiring power to store, the compensation load is programmed to require an amount of power substantially equal to the power required to store 1 data bit requiring power to store.

8. A non-transitory computer readable medium comprising instructions, which, when executed, cause the computer to perform a method, the method comprising:
 receiving electronic data to be stored;
 partitioning the data into multiple segments;
 storing each segment in a memory during a separate write cycle; and
 determining, for each segment, a number of memory cells required for storing the respective segment and
 programming a compensation load, based on the determined number of memory cells, to cause power provided by a power supply to remain substantially constant during the storing of each segment.

9. The non-transitory computer readable medium of claim 8, wherein the data is partitioned into a number of segments, wherein the number of segments is determined based in part on a maximum quantity of data bits requiring power to store.

10. The non-transitory computer readable medium of claim 9, wherein the maximum quantity of data bits requiring power to store is determined based at least in part on a power supplying capacity of the power supply and a power requirement for storing each data bit requiring power to store.

11. The non-transitory computer readable medium of claim 8, wherein each segment has a number of bits requiring power to store, wherein the number of bits requiring power to store is equal to either a maximum quantity of data bits requiring power to store or is equal to N modulo M, where N is equal to the quantity of data bits in the data requiring power to store and M is equal to the maximum quantity of data bits requiring power to store.

12. The non-transitory computer readable medium of claim 11, wherein while storing segments of the maximum quantity of data bits requiring power to store, the compensation load is programmed to require substantially no power, and wherein while storing segments of N modulo M data bits requiring power to store, the compensation load is programmed to require an amount of power substantially equal to the power required to store M-N modulo M data bits requiring power to store.

13. The non-transitory computer readable medium of claim 8, wherein each segment has a number of bits requiring power to store, wherein the number of bits requiring power to store is equal to either N or N-1.

14. The non-transitory computer readable medium of claim 13, wherein while storing segments of N data bits requiring power to store, the compensation load is programmed to require substantially no power, and wherein while storing segments of N-1 data bits requiring power to store, the compensation load is programmed to require an amount of power substantially equal to the power required to store 1 data bit requiring power to store.

15. A memory circuit, comprising:
 a memory array;
 a programmable compensation load;
 a power supply configured to provide power to the memory array and the compensation load; and
 a controller configured to:
  receive electronic data to be stored in the memory array,
  partition the data into multiple segments,
  cause each segment to be stored in the memory array during a separate write cycle,
  determine, for each segment, a number of memory cells required for storing the respective segment;
  program the programmable compensation load, based on the determined number of memory cells, to cause the power from the power supply to remain substantially constant during the storing of each segment.

16. The memory circuit of claim 15, wherein the data is partitioned into a number of segments, wherein the number of segments is determined based in part on a maximum quantity of data bits requiring power to store.

17. The memory circuit of claim 16, wherein the maximum quantity of data bits requiring power to store is determined based at least in part on a power supplying capacity of the power supply and a power requirement for storing each data bit requiring power to store.

18. The memory circuit of claim 15, wherein each segment has a number of bits requiring power to store, wherein the number of bits requiring power to store is equal to either a maximum quantity of data bits requiring power to store or is equal to N modulo M, where N is equal to the quantity of data bits in the data requiring power to store and M is equal to the maximum quantity of data bits requiring power to store.

19. The memory circuit of claim 18, wherein while storing segments of the maximum quantity of data bits requiring power to store, the compensation load is programmed to require substantially no power, and wherein while storing segments of N modulo M data bits requiring power to store, the compensation load is programmed to require an amount of power substantially equal to the power required to store M-N modulo M data bits requiring power to store.

20. The memory circuit of claim 15, wherein each segment has a number of bits requiring power to store, wherein the number of bits requiring power to store is equal to either N or N-1.

21. The memory circuit of claim 20, wherein while storing segments of N data bits requiring power to store, the compensation load is programmed to require substantially no power, and wherein while storing segments of N-1 data bits requiring power to store, the compensation load is programmed to require an amount of power substantially equal to the power required to store 1 data bit requiring power to store.

* * * * *